United States Patent
Couchman et al.

(10) Patent No.: US 8,103,225 B2
(45) Date of Patent: Jan. 24, 2012

(54) MULTIPORT AMPLIFIERS IN COMMUNICATIONS SATELLITES

(75) Inventors: Alan David Couchman, Hitchin (GB); Daryl Richard Jones, Amersham (GB)

(73) Assignee: Astrium Limited, Hertfordshire (GB)

( * ) Notice: Subject to any disclaimer, the term of this patent is extended or adjusted under 35 U.S.C. 154(b) by 768 days.

(21) Appl. No.: 12/160,980

(22) PCT Filed: May 2, 2008

(86) PCT No.: PCT/GB2008/001553
§ 371 (c)(1), (2), (4) Date: Jul. 15, 2008

(87) PCT Pub. No.: WO2008/135753
PCT Pub. Date: Nov. 13, 2008

(65) Prior Publication Data
US 2010/0156528 A1    Jun. 24, 2010

(51) Int. Cl.
H04B 7/185 (2006.01)
H04B 1/00 (2006.01)
H04B 7/00 (2006.01)
H04Q 11/12 (2006.01)

(52) U.S. Cl. ............... 455/127.1; 455/127.2; 455/522; 455/69; 455/13.1

(58) Field of Classification Search ............... 455/13.4, 455/13.1, 12.1, 417, 418, 419, 127.1, 127.2, 455/522, 69
See application file for complete search history.

(56) References Cited

U.S. PATENT DOCUMENTS

| | | | |
|---|---|---|---|
| 5,121,077 A * | 6/1992 | McGann | 330/149 |
| 5,329,244 A * | 7/1994 | Fujita et al. | 330/149 |
| 5,528,196 A * | 6/1996 | Baskin et al. | 330/151 |
| 6,006,111 A | 12/1999 | Rowland | |
| 6,243,038 B1 * | 6/2001 | Butler et al. | 342/373 |
| 6,421,528 B1 * | 7/2002 | Rosen et al. | 455/67.16 |
| 6,744,316 B2 * | 6/2004 | Louis et al. | 330/151 |
| 6,859,097 B2 * | 2/2005 | Chandler | 330/107 |
| 6,934,341 B2 * | 8/2005 | Sahlman | 375/297 |
| 7,088,173 B1 | 8/2006 | Rozario et al. | |
| 7,558,541 B2 * | 7/2009 | Rosen et al. | 455/127.2 |
| 2006/0116090 A1 * | 6/2006 | Rosen et al. | 455/127.2 |

FOREIGN PATENT DOCUMENTS

| | | |
|---|---|---|
| EP | 1 777 813 A1 | 8/2000 |
| EP | 1 152 523 A1 | 11/2001 |
| WO | WO 99/37020 | 7/1999 |
| WO | WO 00/16473 | 3/2000 |
| WO | WO 02/054590 A1 | 7/2002 |
| WO | WO 2006/060114 A1 | 6/2006 |

OTHER PUBLICATIONS

UK Intellectual Property Office, Search Report under Section 17(5) for GB Application No. 0708718.2, Aug. 30, 2007, pp. 1-3.

(Continued)

Primary Examiner — Tilahun B Gesesse
(74) Attorney, Agent, or Firm — Pearl Cohen Zedek Latzer, LLP

(57) ABSTRACT

Feedback loops are used within a Multiport Amplifier (MPA) of a communications satellite to maintain phase and amplitude tracking and hence isolation and combining performance. at Ku and Ka-bands, for which there is increasing interest in MPA applications, and where wavelengths are short and maintenance of phase/amplitude tracking becomes highly challenging. Feedback loops are located at strategic points within the MPA Output Network (ONET) to detect tracking errors and provide compensation. Errors are detected through power measurements at "null points", with zero power corresponding to accurate tracking. The feedback loops adjust the MPA phase/gains such that the levels at these points are maintained at zero. The scheme operates with a pilot signal for measurement of nulls, injected at one of the MPA inputs.

27 Claims, 11 Drawing Sheets

OTHER PUBLICATIONS

European Patent Office, European Search Report for EP Application No. 07 25 1874.9, Sep. 14, 2007, pp. 1-7.

International Preliminary Report on Patentability for International Application No. PCT/GB2008/001553 issued Nov. 10, 2009.

* cited by examiner

| | | Input Port | | | | | | | |
|---|---|---|---|---|---|---|---|---|---|
| | | 1 | 2 | 3 | 4 | 5 | 6 | 7 | 8 |
| Output Port | 1 | $\Phi_{11}$ | $\Phi_{12}$ | $\Phi_{13}$ | $\Phi_{14}$ | Y | Y | Z | OP |
| | 2 | $\Phi_{21}$ | $\Phi_{22}$ | $\Phi_{23}$ | $\Phi_{24}$ | Y | Y | OP | Z |
| | 3 | $\Phi_{31}$ | $\Phi_{32}$ X | $\Phi_{33}$ | $\Phi_{34}$ | Z | OP | Y | Y |
| | 4 | $\Phi_{41}$ | $\Phi_{42}$ | $\Phi_{43}$ | $\Phi_{44}$ | OP | Z | Y | Y |
| | 5 | $\Phi_{51}$ | $\Phi_{52}$ | Z | OP | X | X | X | X |
| | 6 | $\Phi_{61}$ Y | $\Phi_{62}$ | OP | Z | X | X | X | X |
| | 7 | Z $\Phi_{71}$ | OP | Y | Y | X | X | X | X |
| | 8 | OP $\Phi_{81}$ | Z | Y | Y | X | X | X | X |

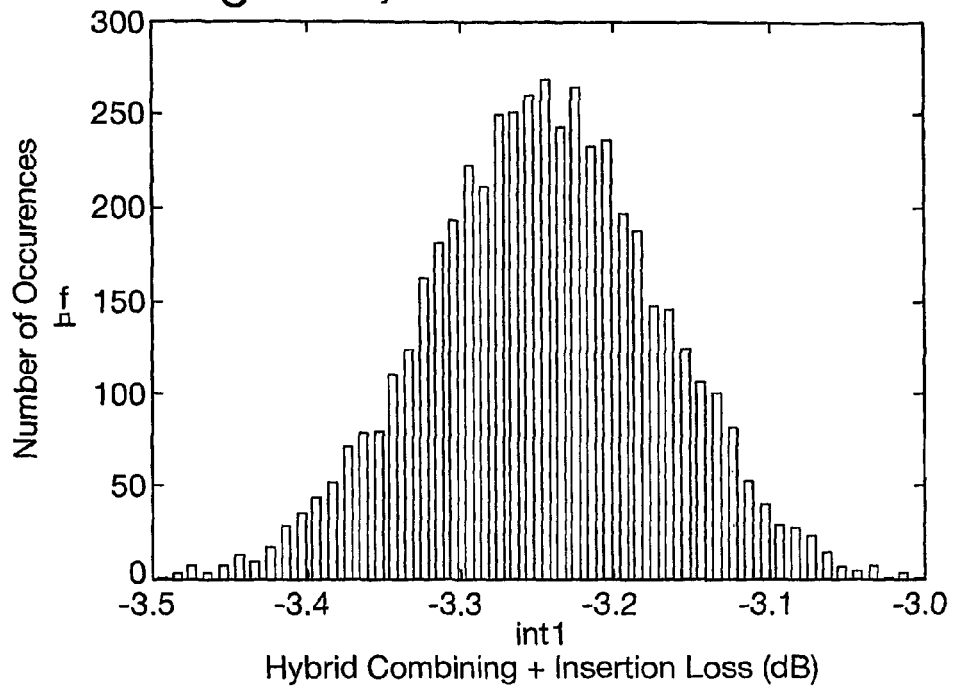
Fig. 14. Hybrid Insertion Loss
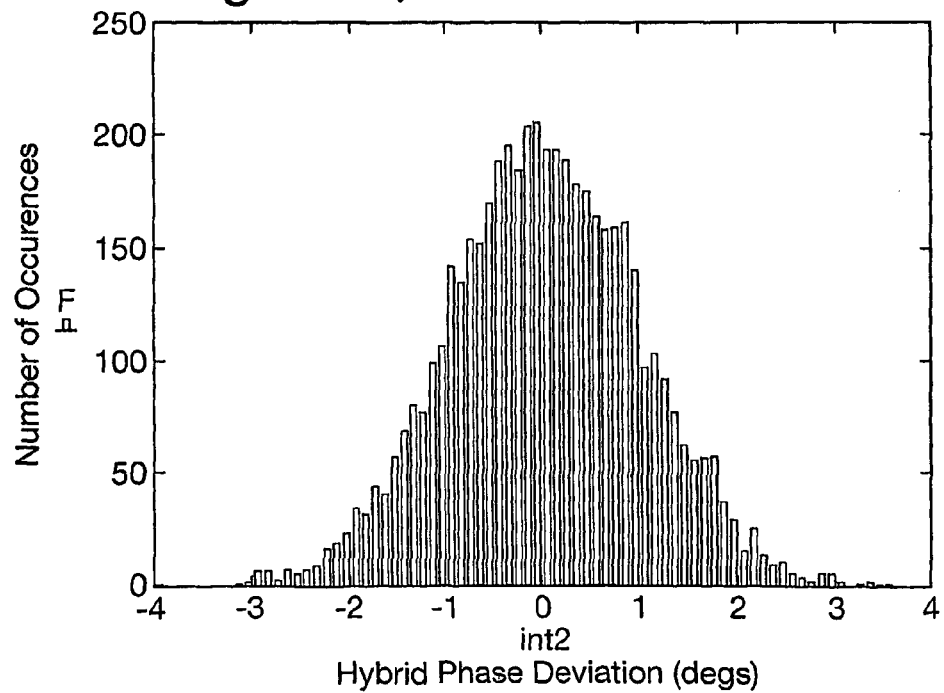
Fig. 15. Hybrid Phase Deviation

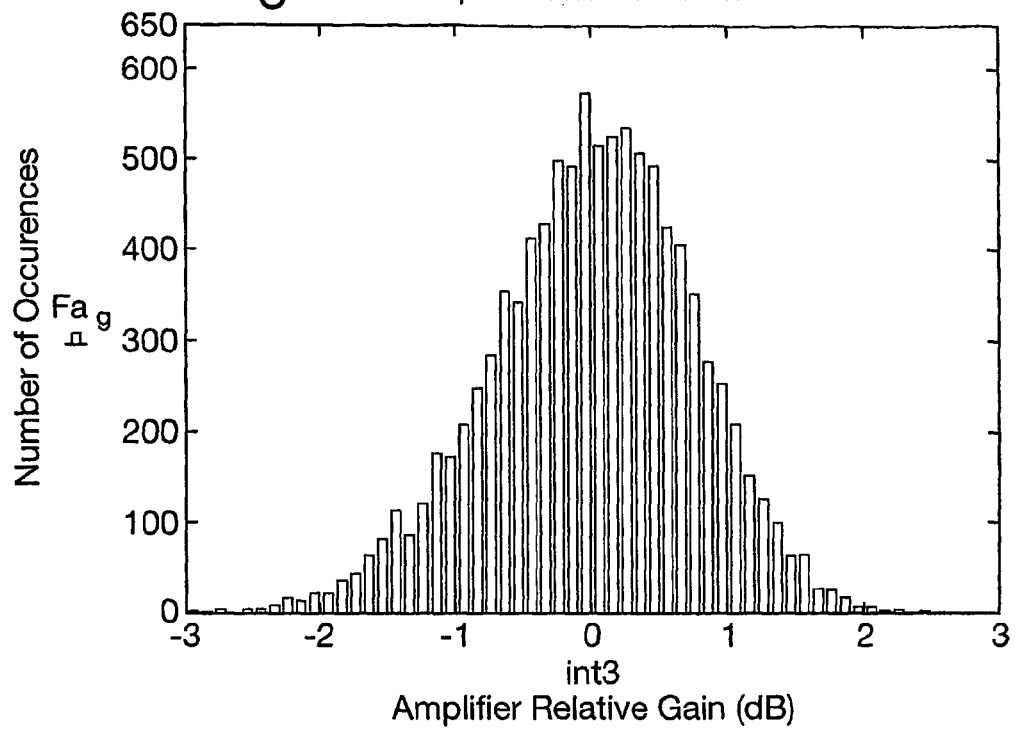
Fig.16. Amplifier Relative Gain
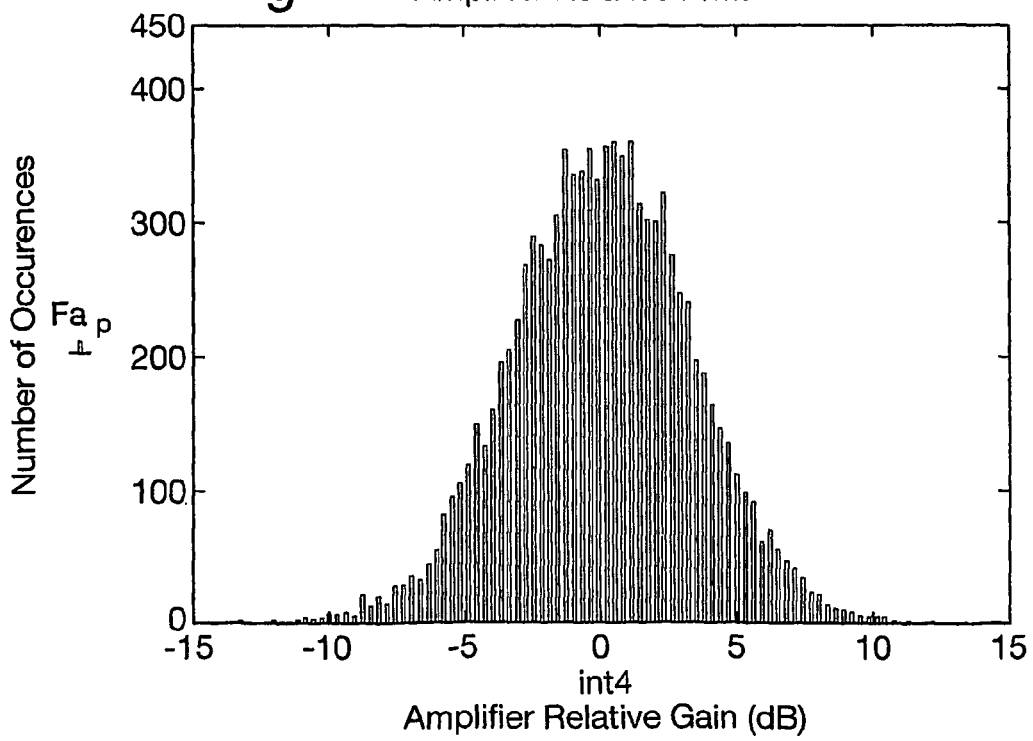
Fig.17. Amplifier Relative Phase

Fig.18.

Isolation Matrix prior to Feedback $$I = \begin{pmatrix} -20.802 & -28.593 & -20.774 & -23.758 & -19.392 & -20.175 & -21.388 & 0 \\ -26.779 & -20.024 & -23.436 & -20.676 & -20.007 & -19.521 & 0 & -22.584 \\ -21.295 & -23.048 & -20.64 & -26.935 & -21.16 & 0 & -18.962 & -18.616 \\ -23.757 & -22.103 & -26.749 & -20.665 & 0 & -26.145 & -18.64 & -19.013 \\ -18.216 & -20.475 & -20.858 & 0 & -19.858 & -28.62 & -22.479 & -26.331 \\ -21.125 & -18.54 & 0 & -16.978 & -28.415 & -19.914 & -26.528 & -22.378 \\ -20.014 & 0 & -17.245 & -21.48 & -21.985 & -26.297 & -20.048 & -28.394 \\ 0 & -22.08 & -21.065 & -17.23 & -25.862 & -22.184 & -27.987 & -20.043 \end{pmatrix}$$

Fig.19

Isolation Matrix after Feedback $$I = \begin{pmatrix} -59.697 & -42.179 & -56.909 & -34.319 & -29.219 & -24.686 & -13.129 & 0 \\ -62.502 & -41.69 & -34.233 & -56.175 & -24.721 & -29.638 & 0 & -13.783 \\ -58.203 & -34.787 & -60.335 & -58.888 & -13.254 & 0 & -27.534 & -22.31 \\ -34.499 & -41.833 & -58.955 & -60.316 & 0 & -14.45 & -22.222 & -27.872 \\ -26.197 & -25.628 & -12.844 & 0 & -40.27 & -38.772 & -37.851 & -31.186 \\ -27.078 & -26.604 & 0 & -11.451 & -39.134 & -40.303 & -31.343 & -37.472 \\ -12.962 & 0 & -25.357 & -27.742 & -36.998 & -31.072 & -39.796 & -39.378 \\ 0 & -14.009 & -27.297 & -25.391 & -31.02 & -38.017 & -39.421 & -39.996 \end{pmatrix}$$

MULTIPORT AMPLIFIERS IN COMMUNICATIONS SATELLITES

CROSS-REFERENCE TO RELATED APPLICATIONS

This application is a national phase application of PCT/GB2008/001553 filed on May 2, 2008, which in turn claims priority from GB Application No. 0708718.2 and EP Application No. 07251874.9, both filed on May 4, 2007, each of which are incorporated by reference herein in their entirety.

TECHNICAL FIELD

This invention relates to multiport amplifiers for use within a satellite communication system, and specifically to a method and apparatus for maintaining isolation within multiport amplifiers.

BACKGROUND ART

Interest continues to grow in the application of Multiport Amplifiers (MPAs) to Ku and Ka-band satellite payloads—See for example, A Couchman, D. Jones, "Optimized Multiport Amplifiers for Wideband Multi-beam Satellites", AIAA, 24th International Communications Satellite Systems Conference, San Diego, USA, June 2006; A. Anakabe, et al, "Ka-band Multi-port Amplifier Characteristics for Space Telecommunication Operation", 6th International Vacuum Electronics Conference, Noordwijk, Netherlands, April, 2005.

MPAs are particularly applicable to Single Feed per Beam (SFB) architectures which generate a set of regular contiguous beams over a defined coverage region, using a system of typically 4 antenna reflectors with associated feedhorns. The beam set employs a high degree of frequency re-use, with each beam generated uniquely by a corresponding feed horn. Such architectures are comparatively highly efficient in terms of RF power generation. However, they are much restricted in the flexibility with which they can distribute this power over the coverage area. The application of MPAs, with each feedhorn driven by a respective MPA output, would greatly increase the flexibility of the SFB design, significantly enhancing the flexibility of this architecture by enabling capacity (transmitted power) to follow dynamically changes in traffic distribution over the coverage zone. MPAs could be used in wideband, selectable bandwidth transponders providing flexible allocation of power as well as bandwidth to all beams ensuring optimum link parameters in each case.

An MPA is a well-known power amplifier device used for satellite communications, which operates at the microwave frequency bands. An MPA includes a number N of similar amplifier units (TWT or solid state) in parallel, each having a power P, so that each input signal is amplified equally by each amplifier, to increase the power of each output signal by a factor N, to P×N. N input ports and N output ports are provided, so that an input signal on one input port is routed to the corresponding output port. The input ports are connected to the amplifier units by a low power input network (INET) that may be implemented in any convenient transmission line technology that is appropriate to the circumstances, e.g. microstrip, stripline, coaxial cable, or waveguide. The output ports are connected to the amplifier units by a high power output network (ONET) that is implemented typically using low loss transmission line technology. The ONET is mathematically a reciprocal of the INET, so that a signal presented to the nth input is directed to the nth output. Each network comprises an array of signal dividing waveguide devices. Butler matrices or networks comprising just hybrid devices are normally used for signal division, because they have convenient gain and phase shift properties. A hybrid is a four port signal dividing device comprising two inputs and two outputs, with selective 90° phase shifts; this phase difference may be exploited to improve the isolation characteristics of the networks. However other hybrids and other signal splitting devices may be used which may have 180° phase difference.

The great advantage of an MPA is that in providing access for each input port equally to each amplifier, the accessible power available to each port is N×P, where P is the power of each individual amplifier. Thus the MPA embodies a high degree of flexibility, providing a wide range of output power which can be shared dynamically and in a highly flexible manner between the N inputs (or downlink beams). However a concomitant problem with an MPA is that of cross-talk between MPA output ports, and in general a lack of isolation between signals routed through the MPA.

MPAs, which have been considered for use in multibeam satellites for some time, have been successfully used at L-band and S-band (1.5-2.6 GHz): see S. Egami, M. Kawai, "An Adaptive Multiple Beam System Concept" IEEE Journal on Selected Areas in Communications, Vol. SAC5, No. 4, May 1987. M. Mallison, et al, "Advanced Payload for Multi-beam Satellites that Support High Data Rate Broadband Global Area Network", AIAA, 23rd International Communications Satellite Systems Conference, Rome, September 2005. M. Tanaka, et al, "S-band Multibeam Transmitter for N-STAR", AIAA, 16th International Communications Satellite Systems Conference, Washington, USA, February 1996.

However, these operate at wavelengths which are around a factor of ten longer than those at Ku and Ka-bands (12-20 GHz). The problems of phase and amplitude misalignment of individual amplifiers of an MPA at the Ku/Ka-bands, and hence that of isolation and signal combining performance, become considerably greater and may bring the feasibility of operating MPAs at these frequencies onboard a satellite and over the required service life into question.

U.S. Pat. No. 7,088,173 discloses a method for tuning phase relationships for an MPA, including selecting one of a plurality of test patterns which detects phase information of an amplifier unit of the MPA, detecting an output signal of the test pattern at a designated MPA output, and adjusting a phase relation of the amplifier unit based upon the output signal.

SUMMARY OF THE INVENTION

It is an object of the present invention to provide a multiport amplifier for operating at Ku/Ka bands for maintaining isolation between signals routed through the multiport amplifier.

It is a more specific object of the present invention to provide a multiport amplifier for operating at Ku/Ka bands wherein phase and gain parameters may be monitored and corrected, at least as often as necessary, so as to maintain aligned phase and gain relationships within the multiport amplifier.

For the purposes of the present specification, a multiport amplifier is defined as comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified, equally in normal or typical circumstances, by all amplifier units, and then recombined into an output signal at an output port: such multiport amplifier will be referred to as a "multiport amplifier as defined herein".

In a first aspect, the invention provides a method of maintaining isolation of signals within a multiport amplifier, the multiport amplifier comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified by all amplifier units, and then recombined into an output signal at an output port, the method comprising:

providing at least one of said amplifier units with gain adjusting means and phase adjusting means, and providing a feedback control loop extending from a preselected node in said output signal dividing network to said gain adjusting means and phase adjusting means, injecting a pilot signal into said input signal dividing network, and detecting said pilot signal at said preselected node, so that said feedback loop provides phase and gain adjustment signals.

In a second aspect, the invention provides a multiport amplifier comprising a plurality of microwave power amplifier units, a plurality of input ports and a plurality of output ports, the input ports being connected to said amplifier units by an input signal dividing network, the output ports being connected to said amplifier units by an output signal dividing network, so that an input signal at any input port is amplified, by all amplifier units, and then recombined into an output signal at an output port, and at least one of said amplifier units having gain adjusting means and phase adjusting means, and a feedback control loop extending from a preselected node in said output signal dividing network in order to provide adjustment signals to said gain adjusting means and said phase adjusting means, in response to a pilot signal injected in said input signal dividing network.

Since feedback control loops are, in accordance with the invention, specifically provided, phase and gain adjustments may be carried out as often as desired, during the operation of the multiport amplifier within a satellite communication system—thus rendering the amplifier suitable for operation at the higher Ku and Ka bands.

The present invention proposes, in a preferred embodiment, a system of feedback loops embodied in the MPA to maintain phase and amplitude tracking. These loops may include power sensors located at specific "null points" in the MPA Output Network (ONET), at which the power level is zero for a signal at a given input port and if tracking is achieved. If the power level at these points is not zero, then the sensors produce outputs which are fedback to commandable phase shifters and gain adjusters in series with the individual amplifier units to achieve the required nulls and hence tracking performance.

The system of feedback loops operates with a pilot signal injected into a specific input port. This signal would be placed outside of the normal traffic space, thus ensuring that the tracking compensation system does not interfere with the normal functioning of the MPA.

BRIEF DESCRIPTION OF THE DRAWINGS

A preferred embodiment of the invention will now be described with reference to the accompanying drawings, wherein:

FIG. 14 is a graph showing a simulation of hybrid insertion loss;

FIG. 15 is a graph showing a simulation of hybrid phase deviation;

FIG. 16 is a graph showing a simulation of amplifier relative gain;

FIG. 17 is a graph showing a simulation of amplifier relative phase;

FIG. 18 is a representation of an isolation matrix of an MPA prior to gain and phase correction; and FIG. 19 is a representation of an isolation matrix of an MPA subsequent to gain and phase correction in accordance with the invention.

DESCRIPTION OF THE PREFERRED EMBODIMENT

Nomenclature

A=Amplifier complex gain
C, $C_{nm}$=Hybrid transfer matrix, and transfer coefficient (input m to output n)
G=Amplifier real gain.
$p_m$=Input signal voltage at input port m
$q_n$=Output signal voltage at output port n
$\Phi$, $\Phi_{nm}$=Overall MPA transfer matrix, and matrix element (input m to output n)
$\Gamma$, $\Gamma_{nm}$=MPA INET transfer matrix, and matrix element (input m to output n)
$\Theta$=Amplifier phase shift.
$\Omega$, $\Omega_{nm}$=MPA ONET transfer matrix, and matrix element (input m to output n)

Figure 1:
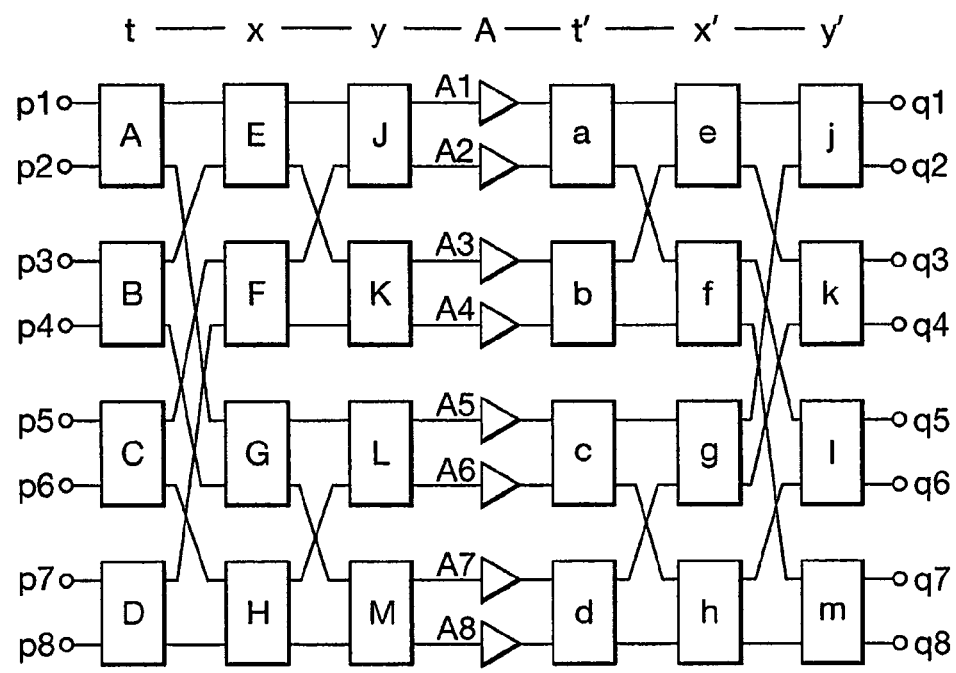
FIG. 1 is a block diagram of an 8 port multiport amplifier (MPA)
Figure 2:
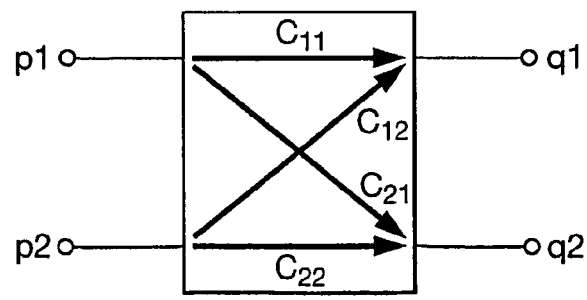
FIG. 2 is a schematic of a hybrid used in the MPA of FIG. 1.

A diagram of an 8 port MPA is shown in FIG. 1. It comprises a set of 3 columns t, x, y of 4 input hybrids, a single column A of 8 amplifiers and a set of 3 columns t', x', y', of 4 output hybrids. A circuit definition of an hybrid (input or output hybrid) is presented in FIG. 2. The input and output signals, $p_1$ & $p_2$ and $q_1$ & $q_2$, are assumed to be complex. The hybrid transfer function is represented thus:

$$\begin{pmatrix} q1 \\ q2 \end{pmatrix} = \begin{pmatrix} C_{11} & C_{12} \\ C_{21} & C_{22} \end{pmatrix} \begin{pmatrix} p1 \\ p2 \end{pmatrix} \quad (1)$$

where $C_{11}$, $C_{12}$, $C_{21}$, $C_{22}$ are all invariable complex coefficients which can be represented as follows:

$$C_{11}=r_{11}\cdot\exp j\cdot\theta_{11}, \; C_{12}=j\cdot r_{12}\cdot\exp j\cdot\theta_{12},$$
$$C_{21}=j\cdot r_{21}\cdot\exp j\cdot\theta_{21}, \; C_{22}=r_{22}\cdot\exp j\cdot\theta_{22} \quad (2)$$

Ideally for a perfect hybrid all $r=1/\sqrt{2}$, and all $\theta=0$, and the transfer matrix becomes:

$$T = 1/\sqrt{2}\begin{pmatrix} 1 & j \\ j & 1 \end{pmatrix} \quad (3)$$

The amplifiers are assumed to be perfectly linear with complex gain A, represented by function:

$$A=G\cdot\exp j\cdot\Theta \quad (4)$$

Ideally in a MPA transponder all amplifiers are matched and have the same value of G and $\Theta$.

The end to end transfer matrix of the MPA is given by:

$$\Phi = y'\cdot x'\cdot t'\cdot A\cdot y\cdot x\cdot t, \text{ or } \Phi = \Gamma\cdot A\cdot\Omega \quad (5)$$

where t, x & y are the transfer matrices of the input hybrid columns (with a combined overall transfer function $\Omega$) and t', x' & y' those of the corresponding output hybrid columns (combined overall transfer function $\Gamma$) as defined in FIG. 1.

The full matrix representation of the end-to-end transfer function $\Phi$ (from Eq. (5)) is mathematically unwieldy and involves successive multiplication by each of six matrices, including a column matrix representing the transfer function of the amplifier set $A_1$ to $A_8$. However, to illustrate specific properties of the MPA transfer function and to deduce from these properties how a tracking feedback loops are incorporated, a selection of elements from the matrix $\Phi$ are presented below in Eqs. (6) to (10). These all relate to I/P port 1, but the general characteristics displayed by the selection of equations would be equally applicable to any of the other I/P ports.

In these equations $\Phi_{nm}$ represents the transfer function going from input port m to output port n. Thus $\Phi_{11}$ (Eqn. (6)—FIG. 3) represents the signal level at I/P port 1, appearing at O/P port 1, $\Phi_{51}$ (Eqn. (8), at O/P port 5—FIG. 4), etc. For an ideal system, $\Phi_{11}$ through to $\Phi_{71}$, should=0 (perfect isolation), with $\Phi_{81}=-j$. However, practical components result in finite isolations between ports.

$$\Phi_{11}=C_{11A}\cdot C_{11J}\cdot[C_{11E}\cdot C_{11e}\cdot(A_1\cdot C_{11J}\cdot C_{11a}+ \\ A_2\cdot C_{21J}\cdot C_{12a})+C_{21E}\cdot C_{12e}\cdot(A_3\cdot C_{11K}\cdot C_{11b}+ \\ A_4\cdot C_{21K}\cdot C_{12b})]+C_{21A}\cdot C_{12J}\cdot[C_{11G}\cdot C_{11g}\cdot \\ (A_5\cdot C_{11L}\cdot C_{11c}+A_6\cdot C_{21L}\cdot C_{12c})+C_{21G}\cdot C_{12g}\cdot \\ (A_7\cdot C_{11M}\cdot C_{11d}+A_8\cdot C_{21M}\cdot C_{12d})] \quad (6)$$

$$\Phi_{41}=C_{11A}\cdot C_{21K}\cdot[C_{11E}\cdot C_{21e}\cdot(A_1\cdot C_{11J}\cdot C_{11a}+ \\ A_2\cdot C_{21J}\cdot C_{12a})+C_{21E}\cdot C_{22e}\cdot(A_3\cdot C_{11K}\cdot C_{11b}+ \\ A_4\cdot C_{21K}\cdot C_{12b})]+C_{21A}\cdot C_{22K}\cdot[C_{11G}\cdot C_{21g}\cdot \\ (A_5\cdot C_{11L}\cdot C_{11c}+A_6\cdot C_{21L}\cdot C_{12c})+C_{21G}\cdot C_{22g}\cdot \\ (A_7\cdot C_{11M}\cdot C_{11d}+A_8\cdot C_{21M}\cdot C_{12d})] \quad (7)$$

$$\Phi_{51}=C_{11A}\cdot C_{11J}\cdot[C_{11E}\cdot C_{11f}\cdot(A_1\cdot C_{11J}\cdot C_{21a}+ \\ A_2\cdot C_{21J}\cdot C_{22a})+C_{21E}\cdot C_{12f}\cdot(A_3\cdot C_{11K}\cdot C_{21b}+ \\ A_4\cdot C_{21K}\cdot C_{22b})]+C_{21A}\cdot C_{121}\cdot[C_{11G}\cdot C_{11h}\cdot \\ (A_5\cdot C_{11L}\cdot C_{21c}+A_6\cdot C_{21L}\cdot C_{22c})+C_{21G}\cdot C_{12h}\cdot \\ (A_7\cdot C_{11M}\cdot C_{21d}+A_8\cdot C_{21M}\cdot C_{22d})] \quad (8)$$

$$\Phi_{71}=C_{11A}\cdot C_{11m}\cdot[C_{11E}\cdot C_{11f}\cdot(A_1\cdot C_{11J}\cdot C_{21a}+ \\ A_2\cdot C_{21J}\cdot C_{22a})+C_{21E}\cdot C_{22f}\cdot(A_3\cdot C_{11K}\cdot C_{21b}+ \\ A_4\cdot C_{21K}\cdot C_{22b})]+C_{21A}\cdot C_{12m}\cdot[C_{11G}\cdot C_{21h}\cdot \\ (A_5\cdot C_{11L}\cdot C_{21c}+A_6\cdot C_{21L}\cdot C_{22c})+C_{21G}\cdot C_{22h}\cdot \\ (A_7\cdot C_{11M}\cdot C_{21d}+A_8\cdot C_{21M}\cdot C_{22d})] \quad (9)$$

$$\Phi_{81}=C_{11A}\cdot C_{11m}\cdot[C_{11E}\cdot C_{21f}\cdot(A_1\cdot C_{11J}\cdot C_{21a}+ \\ A_2\cdot C_{21J}\cdot C_{22a})+C_{21E}\cdot C_{22f}\cdot(A_3\cdot C_{11K}\cdot C_{21b}+ \\ A_4\cdot C_{21K}\cdot C_{22b})]+C_{21A}\cdot C_{22m}\cdot[C_{11G}\cdot C_{21h}\cdot \\ (A_5\cdot C_{11L}\cdot C_{21c}+A_6\cdot C_{21L}\cdot C_{22c})+C_{21G}\cdot C_{22h}\cdot \\ (A_7\cdot C_{11M}\cdot C_{21d}+A_8\cdot C_{21M}\cdot C_{22d})] \quad (10)$$

Inspection of these formulae demonstrates the following:

$\Phi_{11}$, $\Phi_{41}$. (also applies to $\Phi_{21}$ & $\Phi_{31}$, not shown): Ideally the outputs from ports 1 to 4 should be zero (infinite isolation). Isolation for these cases is determined exclusively by the match between pairs of adjacent amplifiers ($A_1/A_2 \ldots A_7/A_8$) and the quality (insertion loss differential and deviation from 90° between O/P ports) of the inner most hybrids J, K, L & M and a, b, c & d. This feature is shown through the underlining of the relevant factors in Eqs. (6) and (7), and the signal flow diagram in FIG. 3. The flow diagram shows that signal cancellation or nulls occur at the nodal points S indicated in the output network of the MPA, at outputs of the first column of output hybrids.

These nulls arise because the differential phase shift through adjacent amplifier pairs and associated innermost hybrids is 180°, Thus in the expression for $\Phi_{11}$ assuming ideal components, $C_{11J}\cdot C_{11a}=+\frac{1}{2}$, $C_{21J}\cdot C_{12a}=-\frac{1}{2}$, $A_1=A_2$, the first underlined expression in Eq. (6) then becomes zero. The same would apply to the other highlighted factors in this equation, and also for $\Phi_{21}$, $\Phi_{31}$ &, $\Phi_{41}$. It can be shown further that this condition would actually apply to the complete set of $\Phi_{nm}$, for n and m$\leq$4. With n and m>4, but$\leq$8, the same conditions would apply, but in these cases the nulls would appear at the opposite output ports of hybrids a, b, c & d.

For practical components there will be equipment mismatches, and so a residual, non-zero voltage will exist at these points.

$\Phi_{51}$. (also applies to $\Phi_{61}$, not shown). In these cases, as demonstrated in the corresponding signal flow diagram (FIG. 4) the output of pairs of adjacent amplifiers ($A_1/A_2 \ldots A_7/A_8$) are initially summed at nodal points S', but cancellation or nulls occur at the output nodal points of the second column of output hybrids (S). Referring to Eq. (8), addition between adjacent amplifiers occurs as a result of (ideally) zero differential phase shift through these amplifiers and inner most hybrids (eg $C_{11J}\cdot C_{21a}=C_{21J}\cdot C_{22a}=+\frac{1}{2}$). However, when the summed inphase outputs from an amplifier pair (eg $A_1/A_2$) are combined by the second hybrid set with those of the adjacent pair ($A_3/A_4$), cancellation occurs. This cancellation is displayed by the two underlined sections of Eq. (8). It results from a differential shift of 180° introduced between adjacent pairs by the middle hybrid columns (eg $C_{11E}\cdot C_{11f}=+\frac{1}{2}$, $C_{21E}\cdot C_{12f}=-\frac{1}{2}$). It can be demonstrated that exactly the same null points occur for an input at port 2. Thus identical null points are produced for all $\Phi_{nm}$, for n and m$\leq$2 With n, m>2, the null points occur at other outputs of the middle hybrid column $\Phi_{71}$. (applies only to this case). In this instance, as shown in the applicable flow diagram (FIG. 5), the null occurs at the output node S of the last column of O/P hybrids (at O/P port 7). In this case the output of pairs of adjacent amplifiers are in-phased summed (at node S' of the first O/P hybrid column). They are then in-phase summed as groups of 4 by the middle hybrid column ($A_1/A_2/A_3/A_4$ and $A_5/A_6/A_7/A_8$) at node S'. Finally the sum outputs from the middle column are added in anti-phase to produce the null at S (port 7). Cancellation occurs, as demonstrated by Eq. (9), by the differential phase shift of 180° introduced by the combination of hybrid A and m (ie $C_{11A}\cdot C_{11m}=+\frac{1}{2}$, $C_{21A}\cdot C_{12m}=-\frac{1}{2}$). In this case there is just the one cancellation point, and the whole of Eq. (9) is underlined as all factors in the expression are involved in producing this single null.

Figure 6:
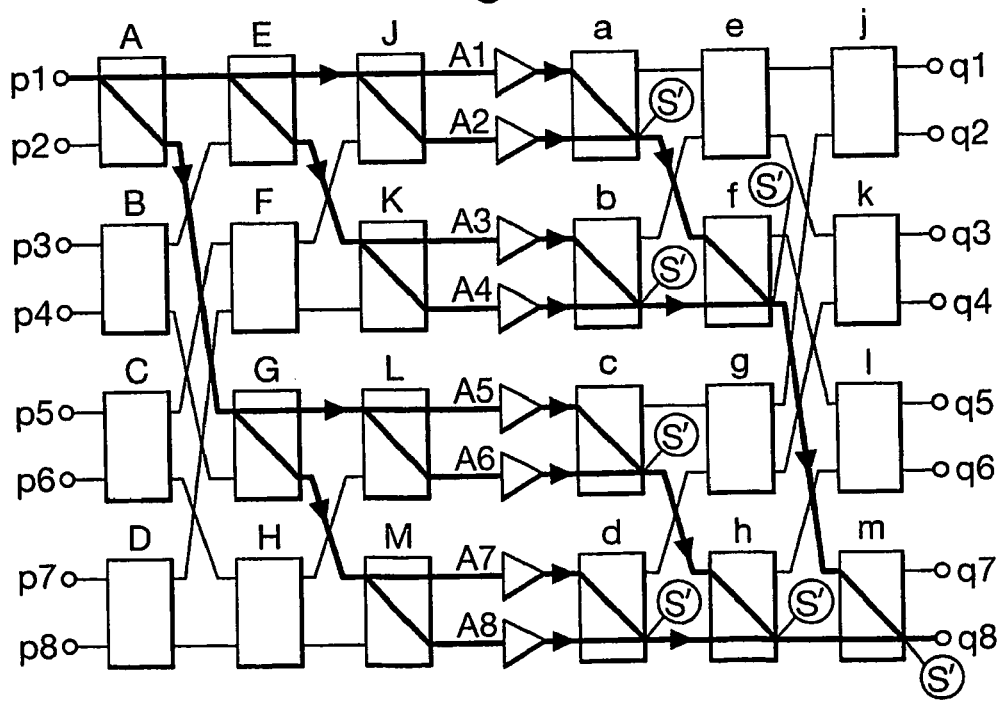
FIG. 6 is a diagram showing signal flow within the MPA of FIG. 1 from UP port 1 to O/P port 5 ($\Phi_{81}$)

$\Phi_{81}$. This is associated with the wanted output. As shown in FIG. 6, constructive addition (at nodal points S') occurs between amplifier outputs throughout the network to output port 8. There is not a null point in FIG. 6.

Figures 7, 8:
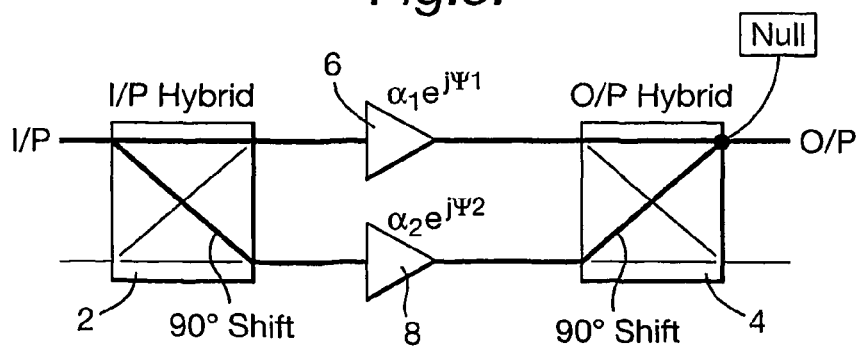
FIG. 7 is a schematic showing Relationship between Null Points and Matrix Elements $\Phi$.
FIG. 8 is a schematic of a hybrid showing formation of a null-point at a node of the hybrid.

The relationship between null points and the MPA transfer matrix may be summarized in the schematic of FIG. 7. This represents the matrix set (Input to Output), and identifies those elements, which share common null points, and indicates which column of output hybrids the nulls occur. The following comments apply to FIG. 7:

Areas denoted by X relate to nulls occurring at the outputs of the first set of O/P hybrids, Y to the second set, and Z to the final set. The entries designated by "OP" relate to the wanted O/P port corresponding to a given I/P;

All elements located within the same X, Y or Z areas share the same null points.

Thus the set $\Phi_{nm}$ (1<n, m≦4) all share the same the same nulls, as do the set $\Phi_{nm}$ (5<n, m≦8), the nulls in all these cases occurring at the first hybrid column. Similarly the set $\Phi_{nm}$ (n=5, 6; m=1, 2) shares common nulls with the nulls occurring at the second hybrid column. For Z, there is only a single element, with the null present at the final hybrid column;

The sets of elements highlighted all share the same set of nulls as the set ($\Phi_{11}$ to $\Phi_{81}$) analyzed above for which matrix expansions and flow diagrams are presented.

A notable feature of the MPA, observed from this table, is if nulls are achieved for any one element in a given area X, Y or Z, then nulls will also be achieved for all other elements within that area. For an ideal MPA in which all components (hybrids and amplifiers) are perfectly matched, then nulls would also be produced for all the other sets X, Y & Z, albeit at different points in the ONET. However perfect matching will not be achieved in practice, and if nulls are achieved for a given X, Y & Z, then for all the other sets X, Y & Z there will be a residual voltage dependent on the degree of mismatches.

In all cases, the generation of a null can be considered as the result of a configuration, as shown in FIG. 8 of input hybrid 2, output hybrid 4, and pair of amplifier units 6, 8. Here, $\alpha_1 e^{j\Psi_1}/2$, and $\alpha_2 e^{j\Psi_2}/2$ represent the total complex gains between the I/P and O/P (the factor of ½ arises from the two hybrids, one either side of the gain elements). The relevance of this configuration to element $\Phi_{11}$ (and all other $\Phi_{nm}$ (1<n, m≧4)) may be seen from FIG. 3 and associated Eq. (6). In these cases taking the amplifier pair $A_1/A_2$ as examples, $\alpha_1 e^{j\Psi_1} = A_1 \cdot C_{11f} \cdot C_{11a}$, and $\alpha_2 e^{j\Psi_2} = -A_2 \cdot C_{21f} \cdot C_{12a}$ (from Eq. (6)).

Assuming for convenience unity voltage at the MPA inputs, the null voltage in this case will be given by:

$$N_v = (\alpha_1 e^{j\Psi_1} - \alpha_2 e^{j\Psi_2})/4 \quad (11)$$

The factor 4 in the denominator in this expression results from the inclusion of 4 hybrids from the MPA input up to the outputs of the first hybrid column. Setting the ratio $\alpha_1/\alpha_2 = \beta$ as the amplitude mismatch between the two paths, and $\theta = \Psi_2 - \Psi_1$ as the corresponding phase mismatch, the null voltage is given by:

$$N_v = \alpha_1(1-\beta e^{j\theta})/4 = \alpha_1 D/4 \quad (12)$$

Where $D_b$ is the null depth given in dB by:

$$D_b = 20\log(|1-\beta e^{j\theta}|) = 20\log(\sqrt{1-2\beta\cos\theta+\beta^2}) \, dB \quad (13)$$

Figure 9:
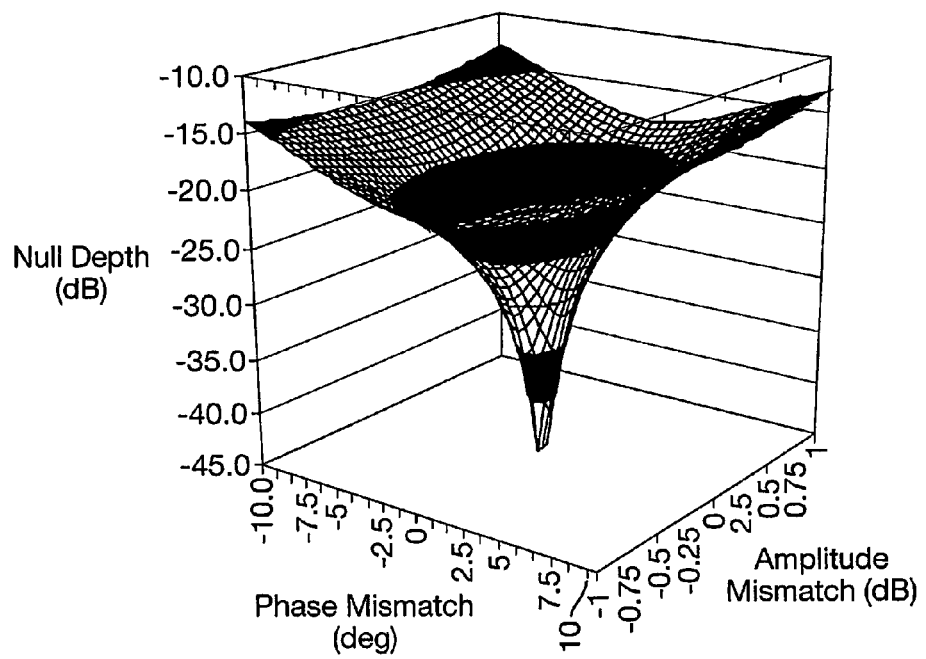
FIG. 9 is a three dimensional graph showing a null-point at a node in the output network of the ONET of FIG. 1, with null depth plotted against amplitude and phase mismatches.

This has been plotted in FIG. 9, with θ in degrees, and amplitude mismatch a in dB, where $\beta = 10^{\alpha/20}$. As an example, for null depth of 20 dB, a phase and amplitude match of 4.5° and 0.5 dB respectively are required. As demonstrated by the plot, this is not a unique solution and an infinite number of solutions exist ranging from 0°, 0.85 dB to 5.7°, 0 dB.

In the case of $\Phi_{11}$, and all other elements located within the areas X in FIG. 7, i.e. those cases for which null points occur at the outputs of the first hybrid columns (as in FIG. 3), there will be 4 nulls.

Assuming the same null depth at each point but with random null phase, then the resulting power level at the MPA outputs for elements in areas X (from Eq. (12)) will be $(\alpha_1 D)^2/16$. Thus in dB terms, the isolations corresponding to the matrix elements in areas X, in FIG. 7 are given by $D_b+12$ dB, where $D_b$ is the null depth expressed in dB. Thus if a null depth of say 16 dB, is achieved, then the isolation will be 28 dB.

In the case of matrix elements such as $\Phi_{51}$ (Eq. (8)), for which nulls occur at the outputs of the second hybrid column (FIG. 4), pairs of amplifier outputs (eg A1/A2) are summed in phase before the null point. Thus the corresponding null voltage will be $\alpha_1 D/2\sqrt{2}$, and the corresponding isolation at the MPA outputs (elements in areas Y of FIG. 7 given by $D_b+9$ dB, again $D_b$ is the null depth in dB.

Finally in the case of matrix elements such as $\Phi_{71}$ (Eq. (9)), for which nulls occur at the outputs of the final hybrid column (FIG. 5), four amplifier outputs (eg $A_1/A_2/A_3/A_4$) are summed in phase before the null point. Thus the corresponding null voltage will be $\alpha_1 D/2\sqrt{2}$, and the corresponding isolation at the MPA outputs (elements in areas Z of FIG. 7) given by $D_b+6$ dB, again $D_b$ is the null depth in dB.

In accordance with the invention, the null points in the MPA ONET, with the depth of null being directly related to the degree of mismatch through the MPA, are monitored by inclusion of feedback loops which measure the null levels and apply feedback to specific components within the MPA to maintain these nulls at zero (or close to), and hence maintain the MPA tracking performance. A set of null locations has been identified above. Furthermore, the related expressions for the MPA transfer matrix elements, examples of which are given in Eq. (6) to (10), identify at which points feedback should be applied.

In order to generate the nulls and enable the system to function, a reference or pilot signal is injected at one input to the MPA (Input 1, in this case). This may be an unmodulated carrier located outside the traffic bands or a spread spectrum signal located within the bands which can be recovered independent of the traffic—in fact any signal which can be recovered clear of the traffic, and which does not cause interference to the traffic or extract significant power from the amplifiers.

Figure 11:
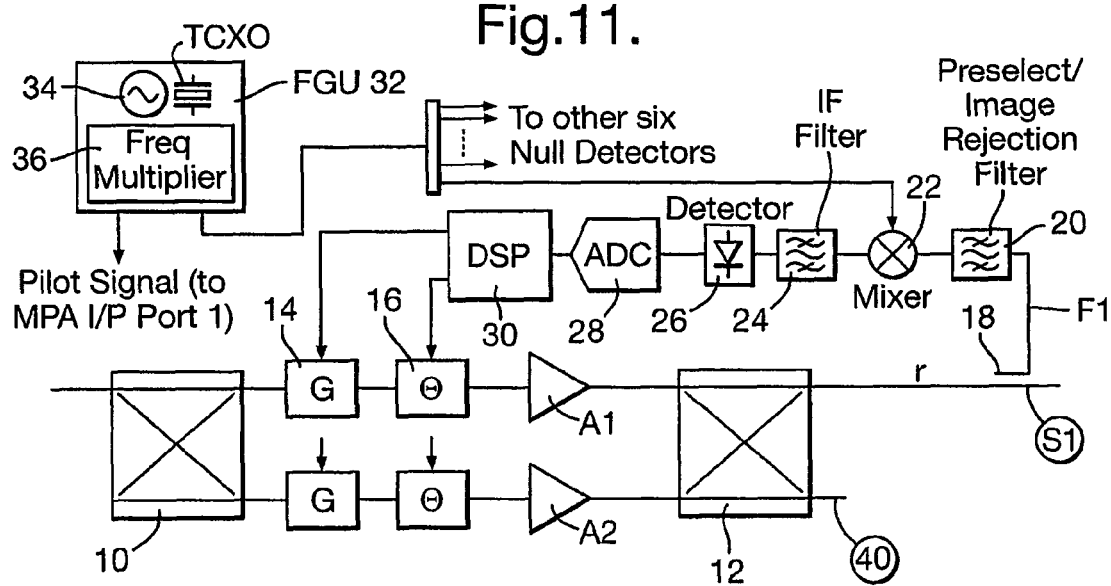
FIG. 11 is a more detailed schematic block diagram of part of FIG. 10.

Referring to FIG. 11 a feedback loop F1 is shown in more detail. Amplifiers A1 and A2 are coupled between input hybrid 10 and output hybrid 12. Each amplifier has a gain adjuster 14 and phase adjuster 16 located in its input signal path. A coupler 18 is provided at the signal node at the output of hybrid 12 where a null S1 is located. The coupler 18 has a coupling coefficient of at least 25 dB to ensure that insignificant power is taken from the amplifiers and to minimise any hybrid imbalances caused through the inclusion of the coupler. The coupler output is filtered by a preselect/image rejection filter 20, downconverted by a mixer 22 to an intermediate frequency (IF), filtered by an IF filter 24 and then fed to an envelope detector 26. The detector output is connected to the input of analogue to digital converter (ADC) 28, the output of which provides a digital signal representing the depth of the null S1. This is fed to a digital signal processor 30 which provides output control signals to the gain and phase adjusters 14 and 16 to minimise the null. Thus a feedback control loop F1 is provided.

A local oscillator signal (LO) for the mixer 22 is derived from a frequency generator unit (FGU) 32, which is also used to generate the pilot signal. Generator 32 comprises a TCXO crystal oscillator 34 driving a frequency multiplier 36 which multiplies up the TCXO frequency to the required pilot signal and the LO frequencies. The pilot signal is connected to the input port (p1) of the MPA by a coupler (not shown), also with a coupling coefficient of at least 25 dB.

The purpose of the preselect/image rejection filter is to prevent the null detection circuitry from being overloaded by the total traffic through the MPA, and to reject signals at the IF image which may otherwise mask the null. The mixer downconverts the null signal to a suitable IF where it can be filtered by a narrow band filter to isolate it from noise, thus ensuring that a null of the required depth can be observed. Fluctuations in the detected null power caused by noise can be suppressed either by a simple analogue filter after the detector, or by digital filtering within the DSP.

This arrangement for null detection assumes that the null depth can be assessed just from measurements at the null port without reference to the pilot signal level. Such a scheme would be acceptable if it could be ensured that after initial calibration of the null depth, variations in the system arising from thermal variations and ageing effects etc would not result in significant changes to the relationship between null power and required null depth. Such changes could be guarded against by including a margin in the null depth equal to or greater than the system variations. Otherwise a reference could be provided by measuring the signal level at the other output port 40 of the hybrid 12 via an additional coupler (not shown). This level would be compared directly by the DSP with the null power to assess the null depth. Measurement of the reference could be alternated with that of the null through an electronic switch. This would be located at the preselect/image filter input and would switch alternately between the null and reference under the control of the DSP.

In order to reduce the equipment numbers associated with the feedback scheme, the DSP and ADC and even more units such as the IF filtering and amplification units could be single elements commutated with a suitable periodicity between the seven feedback loops. This would be configured with the input to the common elements (filter/ADC/DSP) switched sequentially between the null points using electronic switches controlled by the DSP, and with the DSP having 14 control outputs hard wired to the phase and gain adjusters (7 of each).

As an alternative to the CW pilot signal, a carrier modulated by a direct sequence spread spectrum (DSSS) waveform could be used for example with a chip rate at 2 MHz or more. This would operate with a suitable correlator replacing the narrow band IF filter to recover the carrier. This arrangement may be preferred if it is desired to reduce significantly the power spectral density of the pilot signal An example of this scheme is presented here for operation at Ka-band (20 GHz). It is assumed that the pilot signal is CW and is located in that part of the satellite transmission spectrum free of traffic channels, for example that part of the downlink spectrum normally reserved for narrow band satellite beacon and telemetry downlinks. A pilot signal frequency of 20.200 GHz is assumed with a corresponding local oscillator frequency of 20.150 GHz. Thus an IF of 50 MHz is selected—low enough to allow the use of narrowband SAW or crystal filter technologies. In order that the downconversion image is sufficiently rejected, the preselect/image rejection filter must have a rejection of >40 dB at 20.100 GHz.

Such a filter can be implemented from a simple single dual mode cavity design. After downconversion to the 50 MHz IF, the null signal is filtered by a 10 KHz wide crystal IF filter. This is wide enough to permit the use of a relatively low cost, low stability TCXO (eg ±10 ppm over life or ±500 Hz within the IF bandwidth), but narrow enough to ensure that the transponder noise is rejected to a level which does not significantly degrade the null depth.

For a worst case analysis, the noise falling in the null has been determined for a satellite communications payload operating with a minimum saturation flux density SFD of −115 dBW and MPA amplifier power of 130 W (ie a total transponder gain up to the amplifier output of 136.1 dB). Assuming a typical Ka-band transponder end-to-end system noise temperature of 600K (27.8 dBK), and Receive Section input demultiplexer DEMUX filtering in the vicinity of the null of 25 dB (which also provides protection of any neighbouring beacon and telemetry downlinks), then the total noise falling within the null S1 (in the 10 KHz IF bandwidth) is −49.7 dBW. In the case of post DEMUX noise the total power falling within the null is −48 dBW (based on a total maximum post DEMUX amplification of 106 dB, with a typical noise figure of 10 dB for the post DEMUX section at maximum gain). In the case of intermodulation noise falling within the null, it is assumed that the system is transmitting 8 equal power carriers, each supporting a 45 MSymbol/sec QPSK transmission, with amplifiers operating at 2.5 dB output back off. Assuming a typical carrier to $3^{rd}$ order intermodulation level C/Im of 15 dB (for a linearised TWTA), and that the peak of the intermodulation product falls on the null, then the product noise power in the IF bandwidth is −41.9 dBW. The total from all three of the above noise sources is then −40.4 dBW.

In order that the null is not significantly affected by the noise, the minimum null level should be at least 10 dB above noise, ie at ≧−30.4 dBW. Assuming a minimum required null depth of 25 dB (for an isolation of >30 dB), then the required pilot signal power at the output of each amplifier should be ≧0.35 W, say 0.5 W. This represents a loss of only 0.03 dB from the 130 W amplifier operating at 2.5 dB output back off.

The formation of zeros or nulls of acceptable depth at the null points presents some difficulty as the depth is dependent on two variables—amplitude and phase (G & Θ), and does not have a unique solution for non-zero cases. A method in accordance with the invention to overcome this is to introduce a phase deviation about the null, to identify or "seek out" a voltage minimum. With the phase then held to produce the identified minimum, the attenuation is then adjusted to achieve the desired null depth. This process, as well as the feedback, is carried out under the control of a digital signal processor (DSP).

Figure 12:
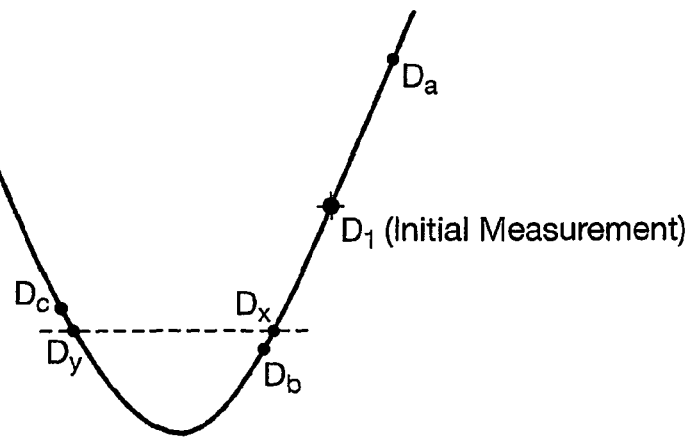
FIG. 12 is a diagram indicating phase adjustment to achieve a desired null value, in accordance with the invention.
Figure 13:
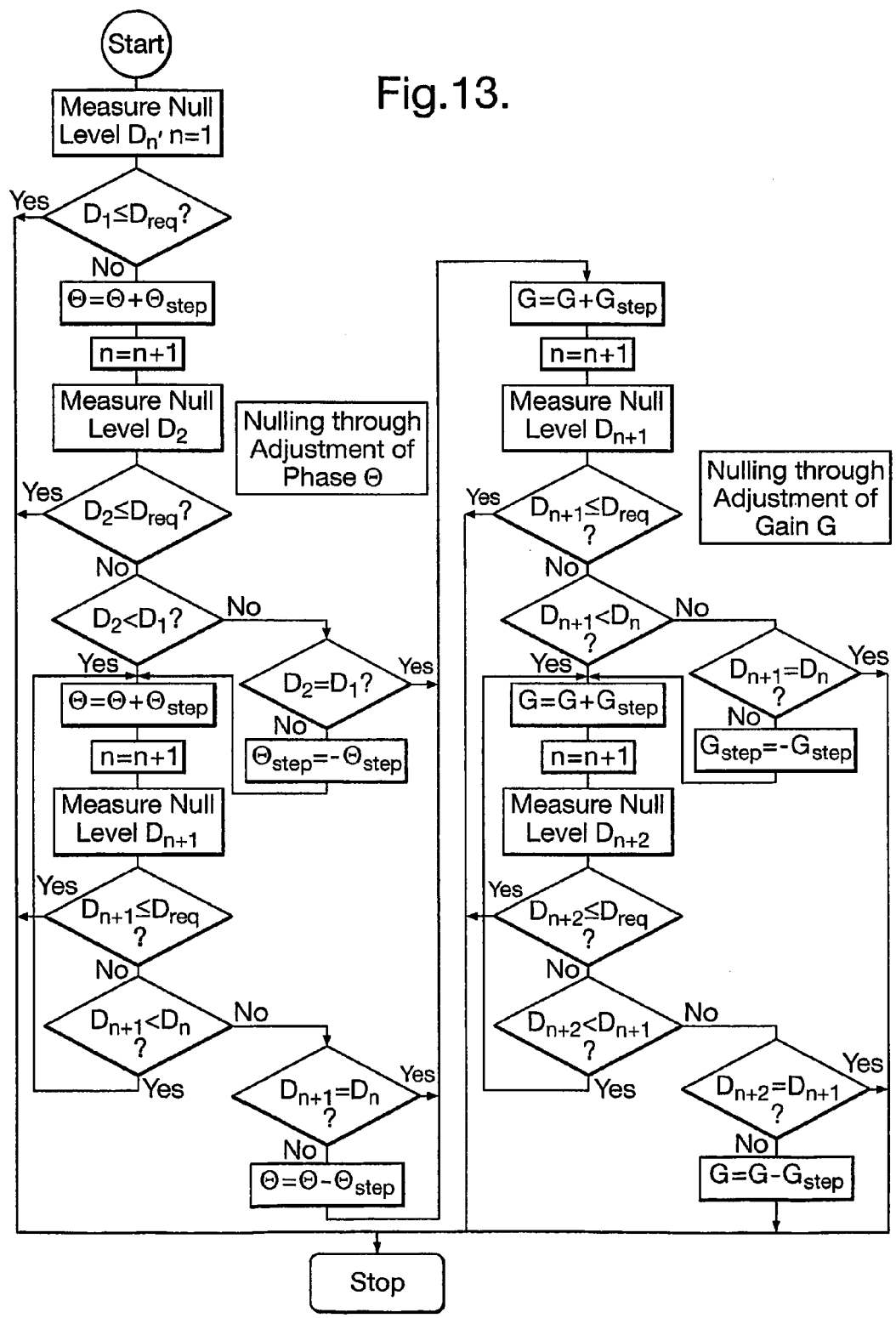
FIG. 13 is a flowchart showing steps in adjusting phase and gain to achieve a desired null value, in accordance with the invention.

Referring to FIGS. 12 and 13, which are a diagram and flowchart of a gain and phase adjustment process to achieve a desired null, this process would be carried out at set intervals, with sufficient regularity to ensure that the MPA performance is held within specified limits. It starts with a measure of the current null depth $D_1$ (see FIG. 12), assumed in this case to be above, or to the right of the null. If the null depth $D_1$ is below the level $D_{req}$, required to provide the desired isolation then no adjustments are made and the process is stopped. Otherwise the phase adjuster is incremented in phase by one positive step $\Theta_{step}$ and the null re-measured. Again if the null depth is below the level $D_{req}$, the process is stopped. If not, and if the second measurement is greater than the first ($D_a$ in FIG. 12), the phase increment $\Theta_{step}$ is reversed in sign and then repeatedly added until either the null depth is below $D_{req}$ or until the next measurement is higher than its predecessor (eg measurement $D_c$ compared with the previous measurement $D_b$), at which point a single increment is subtracted to bring the system back to the lowest null level ($D_b$) that can be achieved through phase adjustments alone. If the second measurement is below the first (ie corresponding to the case in which the initial measurement is to the left of the null in Figure B), then no sign reversal is applied to the phase increment before the repeated addition. This process allows for the possibility of the null occurring midway between two increments, each of which produces the same null level ($D_x$ and $D_y$ in FIG. 12). In this case the minimum achievable null depth is taken as the last measurement ($D_y$).

If the required null depth cannot be obtained by phase adjustments alone, then the process moves onto adjustment of gain G. This is done in exactly the same manner as for the phase adjustments, but in this case the increments are in steps of gain $G_{step}$. During this process the phase is held at that value which resulted in the minimum null depth obtained from the phase adjustment procedure described previously.

The whole of this process embodies a fail safe outcome, in that if no null can be produced which is below the required level $D_{req}$, then the process stops when the minimum achievable null through both gain and phase adjustments has been reached. Such a situation in which the required null level cannot be attained may occur through failure of some component. However the resulting isolation performance may still be acceptable.

The loops F1, F2 and F3 form a cascaded set with successive loops in the cascade operating with nulls in the next hybrid column.

Figure 3:
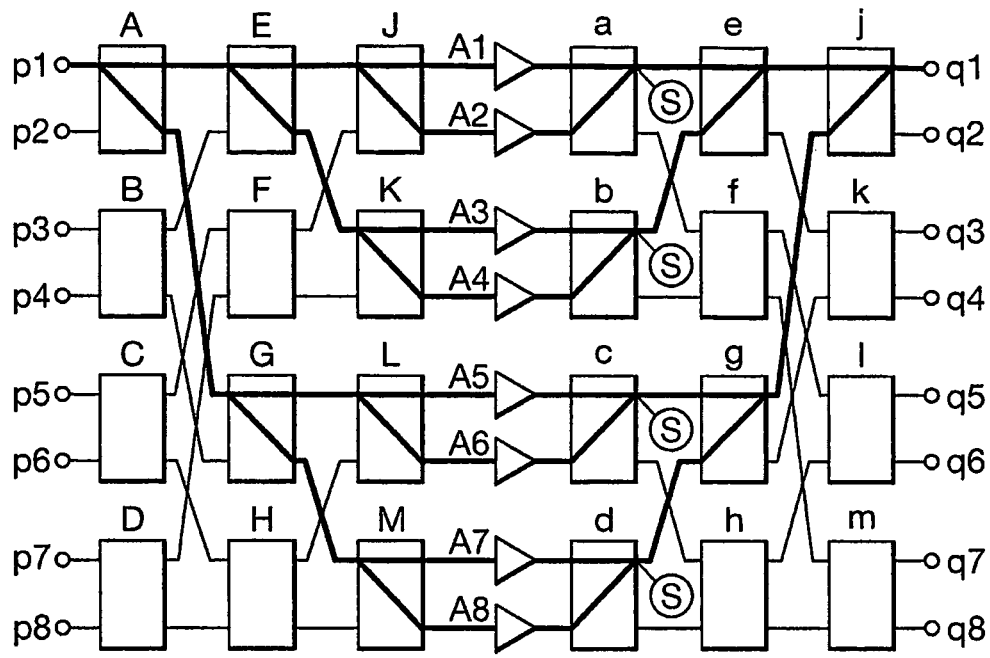
FIG. 3 is a diagram showing signal flow within the MPA of FIG. 1 from UP port 1 to O/P port 1 ($\Phi_{11}$)
Figure 10:
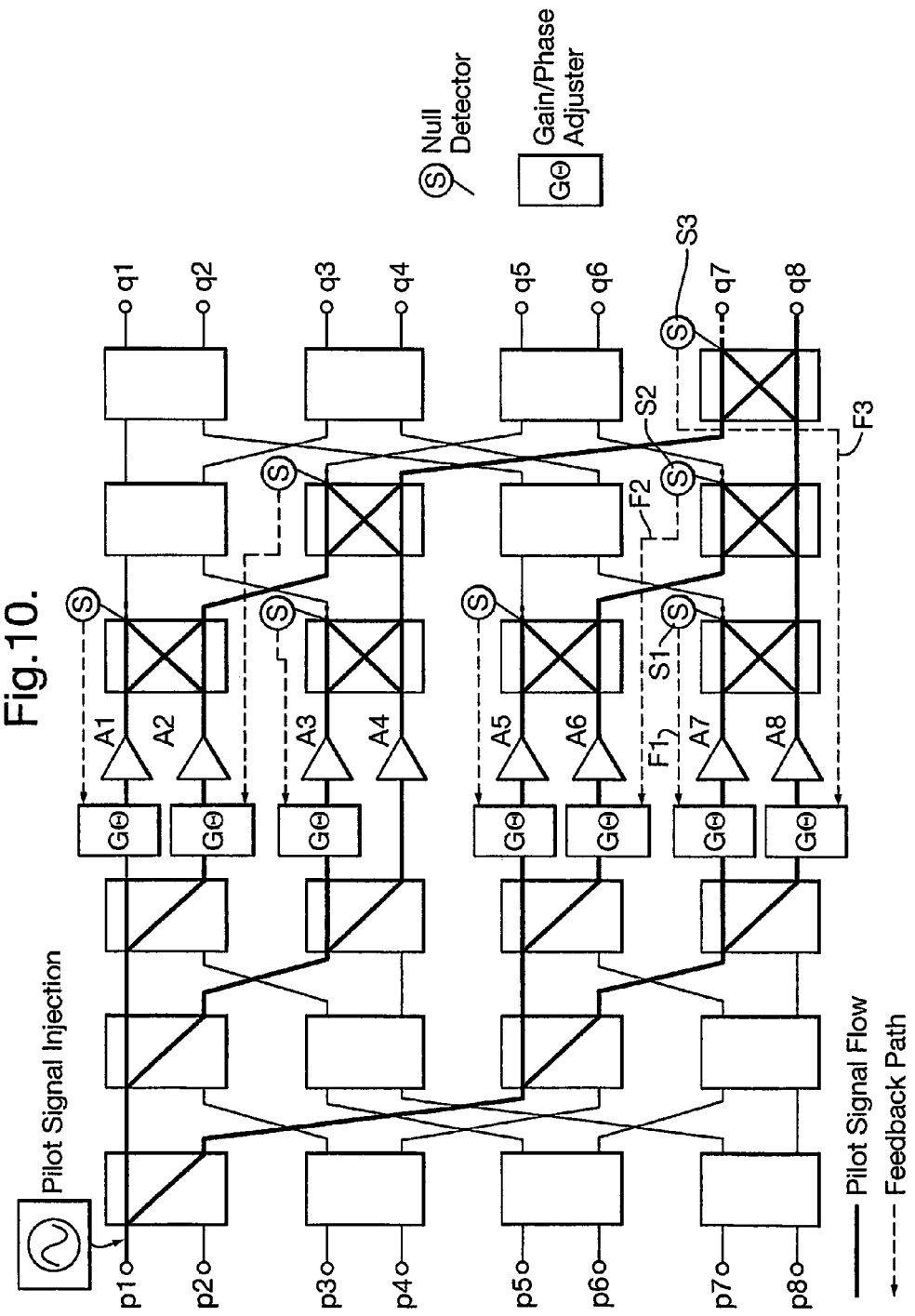
FIG. 10 is a schematic block diagram of an embodiment of the invention.

The first set of loops F1 operates from nulls in the first hybrid column, as identified in FIGS. 3, 10, and operates on pairs of amplifiers ($A_1/A_2 \ldots A_7/A_8$). Referring to Eq. (6) & (7), a full set of nulls is obtained when the underlined bracketed factors ($A_1 \cdot C_{11j} \cdot C_{11a} + A_2 \cdot C_{21j} \cdot C_{12a}$), ($A_3 \cdot C_{11K} \cdot C_{11b} + A_4 \cdot C_{21K} \cdot C_{12b}$), ($A_5 \cdot C_{11L} \cdot C_{11c} + A_6 \cdot C_{21L} \cdot C_{12c}$) & ($A_7 \cdot C_{11M} \cdot C_{11d} + A_8 \cdot C_{21M} \cdot C_{12d}$) are all at zero. If a null (S) is not obtained, then a control signal is fed back to a commandable gain and phase adjuster (G,Θ), prior to an amplifier ($A_1$, $A_3$, $A_5$ & $A_7$) within the corresponding amplifier pair to achieve the null.

Figure 4:
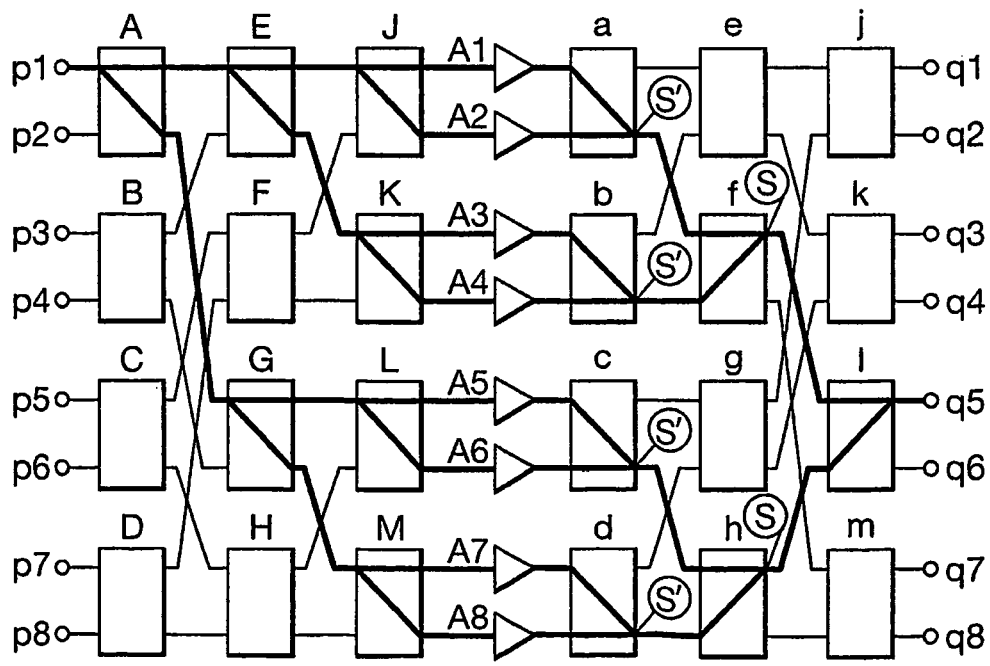
FIG. 4 is a diagram showing signal flow within the MPA of FIG. 1 from UP port 1 to O/P port 5 ($\Phi_{51}$)
Figure 5:
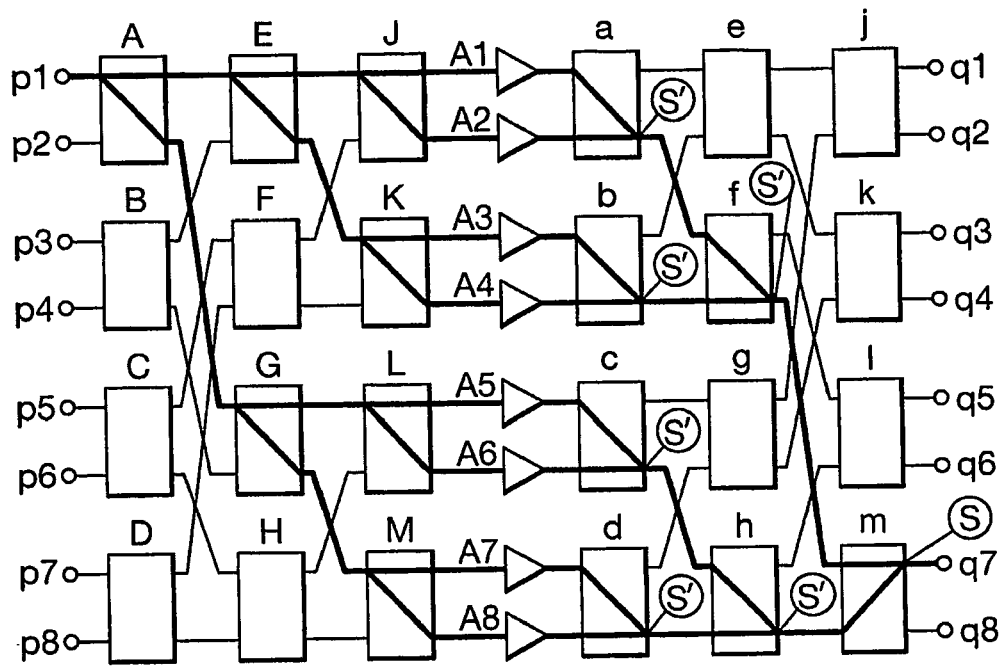
FIG. 5 is a diagram showing signal flow within the MPA of FIG. 1 from UP port 1 to O/P port 7 ($\Phi_{71}$)

As a consequence of nulls at the indicated O/P ports of the first hybrid column, the opposite hybrid ports will provide inphase summations of the amplifier pair outputs ($A_1/A_2 \ldots A_7/A_8$). These inphase summations are fed to the next (middle) column of hybrids. Referring to Eq. (8), nulls at the output of these hybrids is achieved when the highlighted factors $[C_{11E} \cdot C_{11f} \cdot (A_1 \cdot C_{11j} \cdot C_{21a} + A_2 \cdot C_{21j} \cdot C_{22a}) + C_{21E} \cdot C_{12f} \cdot (A_3 \cdot C_{11K} \cdot C_{21b} + A_4 \cdot C_{21K} \cdot C_{22b})]$ & $[C_{11G} \cdot C_{11h} \cdot (A_5 \cdot C_{11L} \cdot C_{21c} + A_6 \cdot C_{21L} \cdot C_{22c}) + C_{21G} \cdot C_{12h} \cdot (A_7 \cdot C_{11M} \cdot C_{21d} + A_8 \cdot C_{21M} \cdot C_{22d})]$ are zero. These two expressions represent the inphase summation of amplifier pairs ($A_1/A_2 \ldots A_7/A_8$) defined by the expressions in the innermost brackets, with cancellation of these summations from adjacent pairs ($A_1/A_2$ with $A_3/A_4$, and $A_5/A_6$ with $A_7/A_8$), the same as shown in FIG. 4. If nulls S2 are not obtained, then control signals are fed back in loops F2 to commandable gain/phase adjusters prior to defined amplifiers (in this case $A_2$, and $A_6$).

The O/P ports opposite to the null ports of the two hybrids in the middle column provide inphase summations of sets of four amplifiers ($A_1/A_2/A_3/A_4$ & $A_5/A_6/A_7/A_8$). These inphase summations of four are fed to the last hybrid column. Here the single null S3 (in this case at port 7) corresponds to the cancellation of the two sets of four ($A_1/A_2/A_3/A_4$ with $A_5/A_6/A_7/A_8$) as defined in Eq. (9). Similarly if a null is not obtained here, then a control signal is fed back in feedback loop F3 to a gain/phase adjuster prior to a defined amplifier (in this case $A_8$).

Note that there is one amplifier which does not have a gain/phase adjuster, i.e. A4. There has to be one amplifier to act as the reference against which all the other units are ultimately matched. The selection of A4 is arbitrary and any other amplifier could equally well be chosen.

The sequencing or comparative reaction times of the loops are critical. The fastest reacting loops are the innermost F1, which brings into alignment (phase/amplitude match) the amplifiers pairs (A1/A2, A7/A8). After the pairs have been aligned and allowed to settle, the next loops F2 acting through the nulls in the middle hybrid column then come into play. These align groups of four amplifiers ($A_1/A_2/A_3/A_4$, $A_5/A_6/A_7/A_8$). The final loop F3, acting through the null in the outermost hybrid column effectively aligns or matches all eight amplifiers (after the middle loops have had time to settle), with the resulting final summation occurring at the wanted output (in this case O/P port 8). The whole process of alignment will be recursive, since an adjustment produced by an outer loop will influence an inner loop. For example, when the phase/amplitude adjuster associated with $A_2$ to achieve the null in the middle column is altered, the adjuster associated with $A_1$ may need to change to maintain the null in the first column. This whole recursive process, which will have the global objective of achieving nulls at all the identified points, will be an extended procedure. However, the varying factors which would cause the loops to apply adjustments would be slowly time variant. These would include component ageing, thermal variations caused for example by diurnal changes in the spacecraft temperatures, and traffic variations which may also be of a diurnal nature. Thus once the feedback system has acquired the nulls and has settled, maintenance of tracking should be fairly uneventful.

The process described above, acting with the null points identified and with the pilot signal injected as indicated will provide active matching for the matrix elements highlighted in FIG. 7. The corresponding output port isolations and level at the wanted ports (related to combining loss) will be under the direct control of the feedback scheme. The remaining elements will be under indirect control, in that the nulls for these cases will be related to the controlled nulls, but will have a residual voltage dependent on the quality (phase and amplitude matching) of the individual hybrids or INET and ONET as a whole. Since this relationship is essentially exclusively defined by the INET and ONET matching, the basic difficulty of ensuring acceptable tracking of the amplifiers will have been avoided. Isolation performance will now depend essentially on the stability of passive units such as machined waveguide parts which should be high. However, this will be true in the vicinity of the pilot signal frequency. Away from this frequency there may be contributions to the residual null voltage arising from frequency related tracking errors between the amplifiers and hybrids over a wide band.

Techniques which may be employed to reduce the effect of these errors include use of multiple pilot signals distributed across the band, switched frequency or frequency hopped signals and wideband, DSSS (Direct Sequence Spread Spectrum) modulated carriers. Various combinations of these techniques may also be used, for example multiple signals distributed across the band, each of which is DSSS modulated. The application of these techniques would produce null measurements relating to the mean performance of the MPA across the band rather than at a single spot frequency. Correspondingly, the isolation and combining performance of the equipment would be better aligned for wideband operation.

Simulation Results

In order to assess the effectiveness of the feedback loops, a model was developed representing the MPA system illustrated in FIG. 10. Individual models were derived for the INET, combined amplifier and gain/phase adjusters and ONET, which were then cascaded to provide a model for the overall MPA.

As previously stated, the achieved port isolation is a function of the amplitude and phase deviations of the individual components around their nominal values. If these components were ideal then infinite isolation would be obtained between the wanted outputs and the unwanted outputs, but as they are not ideal a finite isolation results. The amplitude and phase deviations for each component have been modeled as Gaussian random variables with the mean values and variances presented in the Table above. These values are considered as being practicable at Ku/Ka band.

The values quoted for the hybrids have been used for both the INET and ONET, and correspond to those expected for waveguide hybrids. The amplifier values are based on expected performance for a 130 W Ka-band TWTA.

The distributions obtained for each of the components are presented in FIG. 14 to FIG. 17.

As described above, three feedback loops F1 F3 are employed to maintain the output port isolation below a desired threshold. With reference to FIG. 1 and

| Component | Mean (μ) | Variance (3σ) |
|---|---|---|
| Hybrid: | | |
| Loss (dB) | −3.25 | 0.23 |
| Phase Deviation (°) | 0.0 | 3.0 |
| Amplifier: | | |
| Relative Gain (dB) | 0.0 | 2.0 |
| Relative Phase (°) | 0.0 | 10.0 |

FIG. 10:
  a. The innermost loops F1 provide feedback from output hybrids $H_a$, $H_b$, $H_c$ and $H_d$ (first column) to the gain/phase adjusters associated with amplifiers $A_1$, $A_3$, $A_5$ and $A_7$ respectively. Expressions for the null ports can be derived from Eq. (6) and are given by:

$$C_{11a} \cdot C_{11J} \cdot A_1 \cdot \beta_1 \cdot \exp j \cdot \phi_1 + C_{12a} \cdot C_{21J} \cdot A_2 \cdot \beta_2 \cdot \exp j \cdot \phi_2 = 0 \quad (14)$$

$$C_{11b} \cdot C_{11K} \cdot A_3 \cdot \beta_3 \cdot \exp j \cdot \phi_3 + C_{12b} \cdot C_{21K} \cdot A_4 = 0 \quad (15)$$

$$C_{11c} \cdot C_{11L} \cdot A_5 \cdot \beta_5 \cdot \exp j \cdot \phi_5 + C_{12c} \cdot C_{21L} \cdot A_6 \cdot \beta_6 \cdot \exp j \cdot \phi_6 = 0 \quad (16)$$

$$C_{11d} \cdot C_{11m} \cdot A_7 \cdot \beta_7 \cdot \exp j \cdot \phi_7 + C_{12d} \cdot C_{21m} \cdot A_8 \cdot \beta_8 \cdot \exp j \cdot \phi_8 = 0 \quad (17)$$

b. The middle loops F2 provide feedback from the output hybrids $H_f$ and $H_h$ (second column) to the gain/phase adjusters associated with amplifiers $A_2$ and $A_6$. Expressions for the null port can be derived from Eq. (8) and are given by:

$$C_{11f} \cdot C_{11}E \cdot (C_{21a} \cdot C_{11J} \cdot A_1 \cdot \beta_1 \cdot \exp j \cdot \phi_1 + C_{22a} \cdot C_{21J} \cdot A_2 \cdot \beta_2 \cdot \exp j \cdot \phi_2) + C_{12f} \cdot C_{21}E \cdot (C_{11b} \cdot C_{11K} \cdot A_3 \cdot \beta_3 \cdot \exp j \cdot \phi_3 + C_{22b} \cdot C_{21K} \cdot A_4) = 0 \quad (18)$$

$$C_{11h} \cdot C_{11}G \cdot (C_{21c} \cdot C_{11L} \cdot A_5 \cdot \beta_5 \cdot \exp j \cdot \phi_5 + C_{22c} \cdot C_{21L} \cdot A_6 \cdot \beta_6 \cdot \exp j \cdot \phi_6) + C_{12h} \cdot C_{21}G \cdot (C_{21d} \cdot C_{11M} \cdot A_7 \cdot \beta_7 \cdot \exp j \cdot \phi_7 + C_{22d} \cdot C_{21M} \cdot A_8 \cdot \beta_8 \cdot \exp j \cdot \phi_8) = 0 \quad (19)$$

c. The outermost loop F3 provides feedback between output hybrid $H_m$ (third column) to the gain/phase adjuster associated with amplifier $A_8$. The null port expression can be derived from Eq. (9) and is given by:

$$C_{11m} \cdot C_{11A} \cdot [C_{21f} \cdot C_{11}E \cdot (C_{21a} \cdot C_{11J} \cdot A_1 \cdot \beta_1 \cdot \exp j \cdot \phi_1 + C_{22a} \cdot C_{21J} \cdot A_2 \cdot \beta_2 \cdot \exp j \cdot \phi_2) + C_{12f} \cdot C_{21}E \cdot (C_{21b} \cdot C_{11K} \cdot A_3 \cdot \beta_3 \cdot \exp j \cdot \phi_3 + C_{22b} \cdot C_{21K} \cdot A_4)] + C_{12m} \cdot C_{21A} \cdot [C_{21h} \cdot C_{11}G \cdot (C_{21c} \cdot C_{11L} \cdot A_5 \beta_5 \cdot \exp j \cdot \phi_5 + C_{22c} \cdot C_{21L} \cdot A_6 \cdot \beta_6 \cdot \exp j \cdot \phi_6) + C_{22h} \cdot C_{21}G \cdot (C_{21d} \cdot C_{11M} \cdot A_7 \cdot \beta_7 \cdot \exp j \cdot \phi_7 + C_{22d} \cdot C_{21M} \cdot A_8 \cdot \beta_8 \cdot \exp j \cdot \phi_8)] = 0 \quad (20)$$

where the terms $\beta_i \cdot \exp j \cdot \Phi_i$ represents the magnitude and phase coefficients of the gain/phase adjuster. As amplifier $A_4$ provides acts as the reference there is no gain/phase adjustment associated with it.

From Eqs (14) thru (20) it can be seen that the null port expressions are dependent upon each other; changes made to the gain/phase adjusters in one feedback loop will affect the performance of the other feedback loops. Therefore, finding the minimum target isolation across the MPA becomes an iterative process.

The adopted methodology was to initially set each gain/phase adjuster to provide unity gain and zero phase shift. The null port expressions for the inner loop are then solved for $\beta_1$, $\beta_3$, $\beta_5$, $\beta_7$, $\phi_1$, $\phi_3$, ($\phi_5$, and $\phi_7$. Once these gain/phase adjustments are applied, the null port expressions for the middle loop are then solved for $\beta_2$, $\beta_6$, $\phi_2$, and $\phi_6$. This process is then repeated until convergence occurs: the point where a change in the middle loop's coefficients does not cause a change in the inner loop's coefficients. When this position is reached, the outer loop null port expression is then solved (provided the current isolation was less than the minimum target isolation) for $\beta_8$ and $\phi_8$, causing the inner and middle loops to re-converge. This procedure is repeated until the minimum target isolation of the MPA is met, and is considered to be representative of how the system would operate in practice with the inner loop having the fastest time constant and the outer loop having the slowest.

Results of simulations are provided in FIG. 18 and FIG. 19, below using the inner and middle feedback loops.

FIG. 18, provides the isolation matrix for the MPA prior to any feedback being applied, where each row of the matrix represents an output port (top row=one) and each column represents an input port (left hand column=1). Therefore, the isolation between input port 1 and output port is given by $I_{11}$ and is 20.8 dB. The minimum isolation target for the feedback loops was 25 dB—the degree of isolation that may be applicable to an SFB payload.

As can be seen from FIG. 19, there has been a significant improvement in the isolation performance of the MPA. It should be noted that only the inner and middle feedback loops were used. The isolation in the quadrant denoted 'X' (FIG. 7), has been improved, by up to 20 dB, due to the inner feedback loop. However, because of factors such as noise effects and limited resolution in the phase/amplitude compensations, isolations in excess of 30 dB would most likely not be achieved in practice. Within the quadrant denoted 'Y' (FIG. 7), smaller but notable isolation improvements have been achieved; typically around 6 dB to 8 dB. In the quadrants denoted by 'Z' (e.g. $\Phi_{81}$), the isolation has deteriorated. This has happened for two reasons. The first is that the outermost feedback loop was not included in the simulation, and the second is that without the outermost feedback loop, the adjustments made to the gain/phase shifters by the inner and middle feedback loops would have an effect on the isolation at these points. The actual effect would be determined by the variances of the transmission coefficients in the associated paths, and equally could have improved rather than deteriorated. It is fully expected that the inclusion of the outermost feedback loop would have also provided improved isolation performance in quadrant 'Z'.

The invention claimed is:

1. A method of maintaining isolation within a multiport amplifier for a communications satellite, the multiport amplifier comprising a plurality of microwave power amplifier units, a plurality of input ports and a plurality of output ports, the input ports being connected to said amplifier units by an input signal dividing network, and the output ports being connected to said amplifier units by an output signal dividing network, so that an input signal at any input port is amplified by all amplifier units, and then recombined into an output signal at an output port, the method comprising:

providing at least one of said amplifier units with gain adjusting means and phase adjusting means, providing a feedback control loop extending from a preselected node in said output signal dividing network to said gain adjusting means and phase adjusting means, injecting a pilot signal into said input signal dividing network, and detecting said pilot signal at said preselected node, so that said feedback loop provides phase and gain adjustment signals in dependence on the value of the detected pilot signal, wherein said output signal dividing network includes a first column of output hybrids, each output hybrid of the first column being connected to first and second amplifier units of said plurality of amplifier units and at least one of the first and second amplifier units having gain adjusting means and phase adjusting means, and wherein said preselected node comprises an output port of one of said output hybrids of the first column, at which a signal null of said pilot signal occurs.

2. A method according to claim 1, wherein the depth of the null is dependent on gain and on phase mismatches.

3. A method according to claim 2, wherein the depth of the null is dependent on a logarithmic function which includes phase and gain factors.

4. A method according to claim 2, wherein said gain factor is a ratio of gains between said first and second adjacent amplifier units.

5. A method according to claim 1, wherein phase and gain alignment is carried out in a procedure comprising introducing an iteration of phase increments into said phase adjustment means to identify a null value that is either less than a required value or is a minimum value, while holding gain adjustment constant.

6. A method according to claim 5 wherein said procedure further comprises introducing an iteration of gain increments into said gain adjustment means to identify a null value that is either less than said required value or is a minimum value, while holding phase adjustment constant.

7. A method according to claim 1 wherein said pilot signal is one of a CW wave of constant value, a CW that switches in frequency over time, and a spread spectrum sequence.

8. A method according to claim 1, wherein said input signal dividing network is configured in a matrix and includes a first column of input hybrids, at least one of which has first and second output ports that are coupled to the first and second amplifier units, the first and second amplifier units being adjacent amplifier units, and said output signal dividing network being configured in a matrix, which includes said first column of output hybrids.

9. A method according to claim 8, wherein said input signal dividing network includes a second column of input hybrids coupled to the hybrids of said first column of the input signal dividing network, and said output signal dividing network includes a second column of output hybrids coupled to the hybrids of said first column of the output signal dividing network, and wherein a second preselected node comprises an output port of an output hybrid in said second column, at which a further signal null occurs, and the method further comprising providing a second feedback control loop extending from said second preselected node in said output signal dividing network to a gain adjusting means and a phase adjusting means of one of said amplifier units.

10. A method according to claim 9, wherein said input signal dividing network includes a third column of input hybrids coupled to the hybrids of said second column of the input signal dividing network, and said output signal dividing network includes a third column of output hybrids coupled to the hybrids of said second column of the output signal dividing network, and wherein a third preselected node comprises an output port of an output hybrid in said third column, at which a further signal null occurs, and the method further comprising providing a third feedback control loop extending from said third node in said output signal dividing network to a gain adjusting means and a phase adjusting means in one of said amplifier units.

11. A method according to claim 10,
wherein in a first step, said first and second adjacent amplifier units are aligned in both phase and gain by means of the first-mentioned feedback loop,
wherein in a second step, a group of amplifier units, comprising a plurality of pairs of adjacent amplifier units, are aligned in both phase and gain, by means of said second feedback control loop, and
wherein in a third step, a plurality of groups of amplifier units, each comprising a plurality of pairs of adjacent amplifier units, are aligned in both phase and gain, by means of said third feedback control loop.

12. A method according to claim 11, wherein said first, second and third steps are repeated recursively until a desired phase and gain alignment is achieved for all amplifier units.

13. A method according to claim 9,
wherein in a first step, said first and second adjacent amplifier units are aligned in both phase and gain by means of the first-mentioned feedback loop, and
wherein in a second step, a group of amplifier units, comprising a plurality of pairs of adjacent amplifier units, are aligned in both phase and gain, by means of said second feedback control loop.

14. A method according to claim 8, wherein in a first step, said first and second adjacent amplifier units are aligned in both phase and gain by means of the first-mentioned feedback loop.

15. A method according to claim 14, wherein in said first step, further pairs of adjacent amplifier units, having associated gain adjusting means and phase adjusting means are aligned in both phase and gain, each said further pair having an associated first feedback control loop.

16. A multiport amplifier, comprising:
a plurality of microwave power amplifier units;
a plurality of input ports; and
a plurality of output ports, the input ports being connected to said amplifier units by an input signal dividing network, and the output ports being connected to said amplifier units by an output signal dividing network, so that an input signal at any input port is amplified by all amplifier units, and then recombined into an output signal at an output port,
wherein at least one of said amplifier units includes gain adjusting means and phase adjusting means, wherein the multiport amplifier further comprises a feedback control loop extending from a preselected node in said output signal dividing network in order to provide adjustment signals to said gain adjusting means and said phase adjusting means, in response to a pilot signal injected in said input signal dividing network, wherein said output signal dividing network includes a first column of output hybrids, each output hybrid of the first column being connected to first and second amplifier units of said plurality of amplifier units and at least one of the first and second amplifier units having gain adjusting means and phase adjusting means, and wherein said preselected node comprises an output port of one of said output hybrids of the first column, at which a signal null of said pilot signal occurs.

17. Amplifier according to claim 16, wherein the depth of the null is dependent on gain and on phase mismatches of said amplifier units.

18. Amplifier according to claim 16, wherein said feedback control loop includes a coupler coupled to said preselected node, for sensing said pilot signal at the preselected node.

19. Amplifier according to claim 18, including a further coupler connected to an adjacent node for providing a reference signal, for calibration purposes.

20. Amplifier according to claim 16, wherein the feedback control loop includes mixing means for mixing a detected pilot signal with a local oscillator signal, and including detector means for detecting the heterodyned pilot signal.

21. Amplifier according to claim 16, wherein the feedback control loop includes digital to analog conversion means for converting the detected pilot signal to a digital form, and digital signal processing means operative to compute a function which includes phase and gain factors, representing the depth of the null for generating said adjustment signals.

22. Amplifier according to claim 16, wherein said pilot signal is CW, and said feedback loop includes band pass filter means, or said pilot signal is a spread spectrum signal, and said feedback loop includes a correlator.

23. Amplifier according to claim 16, wherein said input signal dividing network is configured in a matrix and includes a first column of input hybrids, at least one of which has first and second output ports that are coupled to the first and second amplifier units, the first and second amplifier being adjacent amplifier units, and said output signal dividing network being configured in a matrix, which includes said first column of output hybrids.

24. Amplifier according to claim 23, wherein further pairs of adjacent amplifier units of said plurality of amplifier units have associated gain adjusting means and phase adjusting means, and each such, further pair, having an associated first feedback control loop.

25. Amplifier according to claim 24, wherein elements of the feedback loops are shared by means of commutation means.

26. Amplifier according to claim 23, wherein said input signal dividing network includes a second column of input hybrids coupled to the hybrids of said first column of the input signal dividing network, and said output signal dividing network includes a second column of output hybrids coupled to the hybrids of said first column of the output signal dividing network, and wherein a second preselected node comprises an output port of an output hybrid in said second column, at which a further signal null occurs, and the amplifier including a second feedback control loop extending from said second preselected node in said output signal dividing network to a gain adjusting means and a phase adjusting means of one of said amplifier units.

27. Amplifier according to claim 26, wherein said input signal dividing network includes a third column of input hybrids coupled to the hybrids of said second column of the input signal dividing network, and said output signal dividing network includes a third column of output hybrids coupled to the hybrids of said second column of the output signal dividing network, and wherein a third preselected node comprises an output port of an output hybrid in said third column, at which a signal null occurs, and the amplifier including a third feedback control loop extending from said third node in said output signal dividing network to a gain adjusting means and a phase adjusting means of one of said amplifier units.

* * * * *